United States Patent
Zhang et al.

(10) Patent No.: US 7,865,759 B2
(45) Date of Patent: Jan. 4, 2011

(54) PROGRAMMABLE CLOCK CONTROL ARCHITECTURE FOR AT-SPEED TESTING

(75) Inventors: Zaifu Zhang, Irvine, CA (US); Kevin Mun-Wah Chan, La Habra, CA (US); Brian Rust, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 831 days.

(21) Appl. No.: 11/801,817

(22) Filed: May 10, 2007

(65) Prior Publication Data

US 2008/0278205 A1 Nov. 13, 2008

(51) Int. Cl.
*G06F 1/04* (2006.01)
(52) U.S. Cl. .................... 713/501; 713/500; 713/600
(58) Field of Classification Search .......... 713/400, 713/500, 501, 600; 714/30, 733, 734, 744
See application file for complete search history.

(56) References Cited

U.S. PATENT DOCUMENTS

| | | | | |
|---|---|---|---|---|
| 2004/0268181 A1* | 12/2004 | Wang et al. | ............. | 714/30 |
| 2005/0276321 A1* | 12/2005 | Konuk | ............. | 375/224 |
| 2006/0064616 A1* | 3/2006 | Rajski et al. | ............. | 714/726 |
| 2006/0179376 A1* | 8/2006 | Asaka | ............. | 714/731 |
| 2006/0242474 A1* | 10/2006 | Jun et al. | ............. | 714/700 |

OTHER PUBLICATIONS

Bailey, et al., *Test Methodology for Motorola's High Performance e500 Core Based on PowerPC Instruction Set Architecture*, ITC International Test Conference, pp. 574-583 (2002 IEEE).
Iyengar, et al., *At-Speed Structural Test for High-Performance ASICs*, International Test Conference, pp. 1-10 (2006 IEEE).

* cited by examiner

*Primary Examiner*—Dennis M Butler
(74) *Attorney, Agent, or Firm*—Farjami & Farjami LLP

(57) ABSTRACT

According to one exemplary embodiment, an N-stage programmable clock control architecture includes N flip-flops, where the N flip-flops are clocked by a primary clock source, such as a PLL. The N-stage programmable clock control architecture further includes means for programming the N flip-flops such that the N-stage programmable clock control architecture outputs N programmed at-speed clock pulses. For example, when N is equal to 3, three programmed clock pulses can be outputted by the N-stage programmable clock control architecture, with a total of eight different patterns of programmed clock pulses. The N-stage programmable clock control architecture can thus adequately test, for example, combinational logic requiring greater than two consecutive clock pulses for complete at-speed testing. In one embodiment, scan-shift registers can be utilized to program the N flip-flops. In another embodiment, a look-up table can be used to program the N flip-flops.

19 Claims, 4 Drawing Sheets

PROGRAMMABLE CLOCK CONTROL ARCHITECTURE FOR AT-SPEED TESTING

BACKGROUND OF THE INVENTION

1. Field of the Invention

The present invention is generally in the field of testing integrated circuits and modules. More specifically, the present invention is in the field of at-speed testing of integrated circuits and modules.

2. Background Art

As chip designs continue to decrease in size and increase in complexity, it has become more difficult to effectively test defects in the functional logic of a chip. Accurate, inexpensive, and easy to implement testing methods are necessary to ensure that defective chips are not shipped to customers.

In a conventional regular scan test, an automatic test equipment ("ATE") or another testing equipment (such as those used in lab testing or "bench testing")—collectively referred to as a "tester" (or "testers") in the present application—provides a test clock and test data to test the various permutations of the functional logic of the integrated circuit. However, testers are expensive and require a considerable amount of time to thoroughly test the functional logic of the integrated circuit, and have become increasingly inadequate and inaccurate in today's high-speed integrated circuits. Another conventional method, called an "at-speed" test, can test an integrated circuit at the operational frequency of the integrated circuit. However, most testers are incapable of supplying accurate "at-speed" clock and data signals to the integrated circuit and/or detecting and measuring "at-speed" signals from the integrated circuit at these high operating speeds.

To avoid the difficulties and expense of testing the functional logic of integrated circuits with off-chip testers, another conventional method uses an on-chip design. This conventional method modifies a phase-locked loop (PLL) clock to generate a test clock with only two pulses, a launch pulse and a capture pulse. The launch pulse is applied to an integrated circuit, and the capture pulse is used to capture or read the output of the integrated circuit after data has propagated through the integrated circuit's functional logic. However, because this method is limited to producing two consecutive clock pulses (i.e., launch and capture pulses), it is unable to test integrated circuits where data takes longer than one clock pulse to propagate through the functional logic.

SUMMARY OF THE INVENTION

A programmable clock control architecture for at-speed testing, substantially as shown in and/or described in connection with at least one of the figures, and as set forth more completely in the claims.

DETAILED DESCRIPTION OF THE INVENTION

The present invention is directed to a programmable clock control architecture for at-speed testing. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
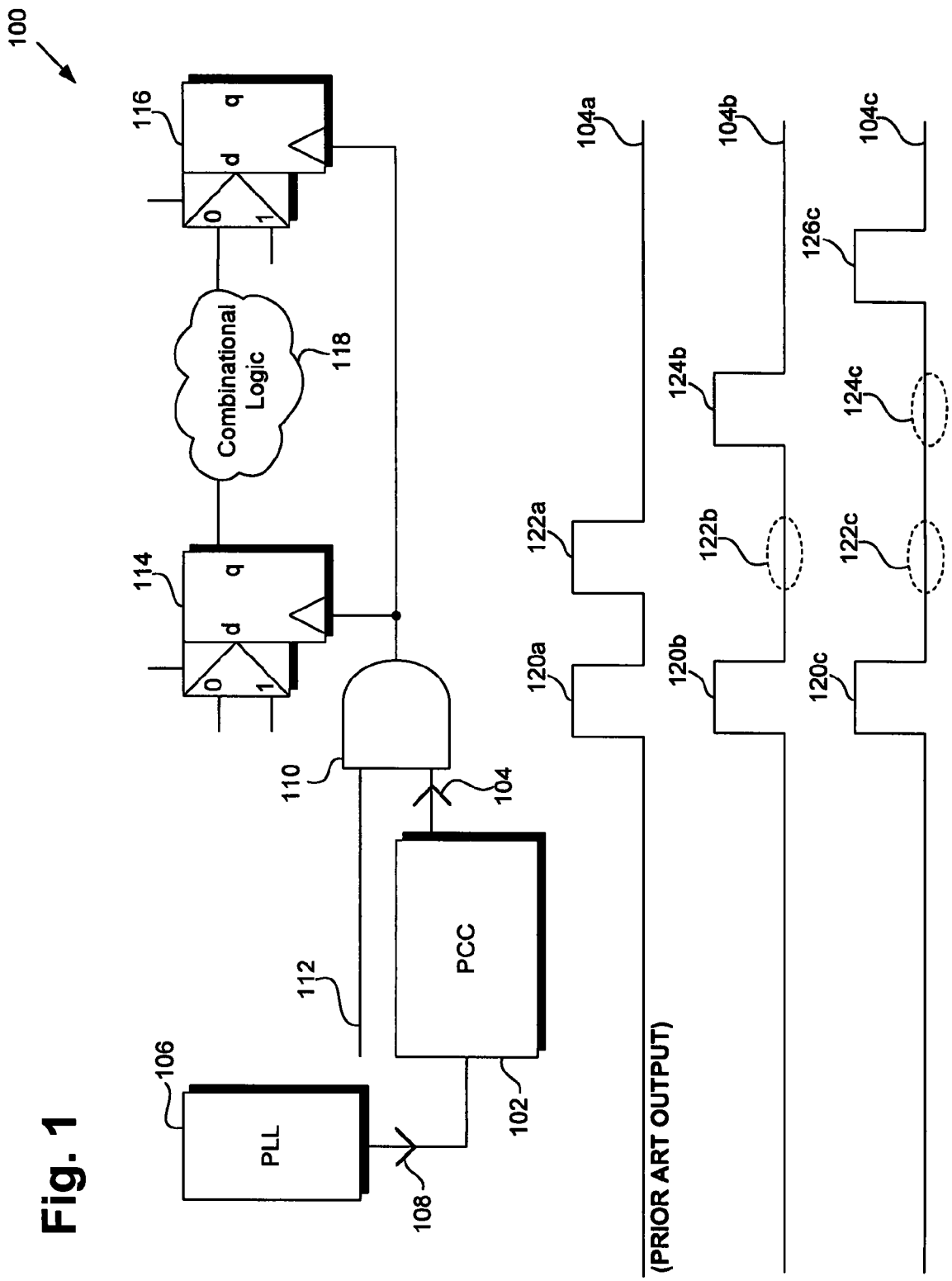
FIG. 1 illustrates a diagram of an electronic system including the invention's exemplary programmable clock control architecture.

FIG. 1 illustrates a diagram of exemplary testing system 100 including programmable clock control (PCC) architecture 102. System 100 can be an on-chip, at-speed testing system, for example. As shown in FIG. 1, testing system 100 further includes phase-locked loop (PLL) 106, logic gate 110, clock enable line 112, launch flip-flop 114, capture flip-flop 116, and combinational logic 118. PLL 106 (also referred to as a "primary clock source" in the present application) outputs PLL clock 108 to PCC architecture 102, which can shape and/or modify PLL clock 108 into programmed at-speed clock 104. PLL clock 108 can be an at-speed clock, i.e., a clock that runs at the operating frequency of the integrated circuit to be tested, and can have a frequency between approximately 200 MHz and 1 GHz, for example. When logic gate 110 is activated by clock enable line 112, PCC architecture 102 provides programmed at-speed clock 104 to flip-flops 110 and 112 for testing the at-speed operation of combinational logic 118. Combinational logic 118 can be, for example, an adder, a multiplier, or other circuitry having combinational logic.

According to conventional techniques, PCC architecture 102 receives PLL clock 108 from PLL 106, and outputs only two consecutive at-speed clock pulses, as shown by output 104a, which consists of clock pulses 120a and 122a. According to conventional techniques, clock pulse 120a can trigger launch flip-flop 114 to activate the operation of combinational logic 118, and clock pulse 122a can trigger capture flip-flop 116 to capture the output of combinational logic 118. Thus, the two consecutive at-speed clock pulses allow only a single clock pulse for the data to propagate through the combinational logic being tested, i.e. the capture clock pulse is separated from the launch clock pulse by only one clock pulse. Since these conventional techniques can only produce exactly two consecutive at-speed clock pulses, they cannot adequately test the at-speed operation of combinational logic 118 when the test data takes longer than one clock pulse to propagate through combinational logic 118, as is common in many advanced integrated circuits.

In contrast, one embodiment of the present invention provides for a PCC architecture 102 capable of providing a variable number of programmed at-speed clock pulses (i.e. not limited to exactly two consecutive at-speed clock pulses) to flip-flops 114 and 116 for testing the operation of combinational logic 118. In other words, two or a greater number of at-speed clock pulses and, further, non-consecutive at-speed clock pulses can be provided. Thus, combinational logic requiring greater number of at-speed clock pulses, e.g. five at-speed clock pulses, and/or requiring non-consecutive at-speed clock pulses, can now be adequately tested. For example, as shown in FIG. 1, output 104b includes clock pulses 120b and 124b, which are separated by "dead clock cycle" 122b. The ability of PCC architecture 102 to program dead clock cycle 122b between clock pulses 120b and 124b permits the testing of combinational logic 118 when test data requires an additional clock pulse to propagate through. For example, if combinational logic 118 requires one additional clock pulse for data to propagate through, then the present invention can test the operation of combinational logic 118 by using clock pulse 120b to trigger launch flip-flop 114 and activate the operation of combinational logic 118, inserting dead clock cycle 122b to allow the data to propagate through combinational logic 118, and then using clock pulse 124b to trigger capture flip-flop 116 and capture the output of combinational logic 118. Similarly, if combinational logic 118 requires two additional clock pulses for data to propagate through, as shown by output 104c, clock pulses 120c and 126c can be separated by two "dead clock cycles," such as dead clock cycles 122c and 124c.

PCC architecture 102 of the present invention can be effectively programmed to output any combination of at-speed test clock pulses, for testing the at-speed operation of an integrated circuit (e.g. combinational logic 118), regardless of how many clock pulses it takes for data to propagate through the integrated circuit. As described above, when two clock pulses are required for data to propagate though combinational logic 118, PCC architecture 102 can be programmed to have an output 104b comprising two clock pulses (i.e., clock pulses 120b and 124b) separated by a dead clock cycle (i.e., dead clock cycle 122b). If additional dead clock cycles or clock pulses are required to test combinational logic 118, then PCC architecture 102 can be programmed to output the additional dead clock cycles, as shown by output 104c, for example. Thus, as described in more detail below, the present invention is not limited to outputting only two consecutive clock pulses as in the conventional techniques.

Figure 2:
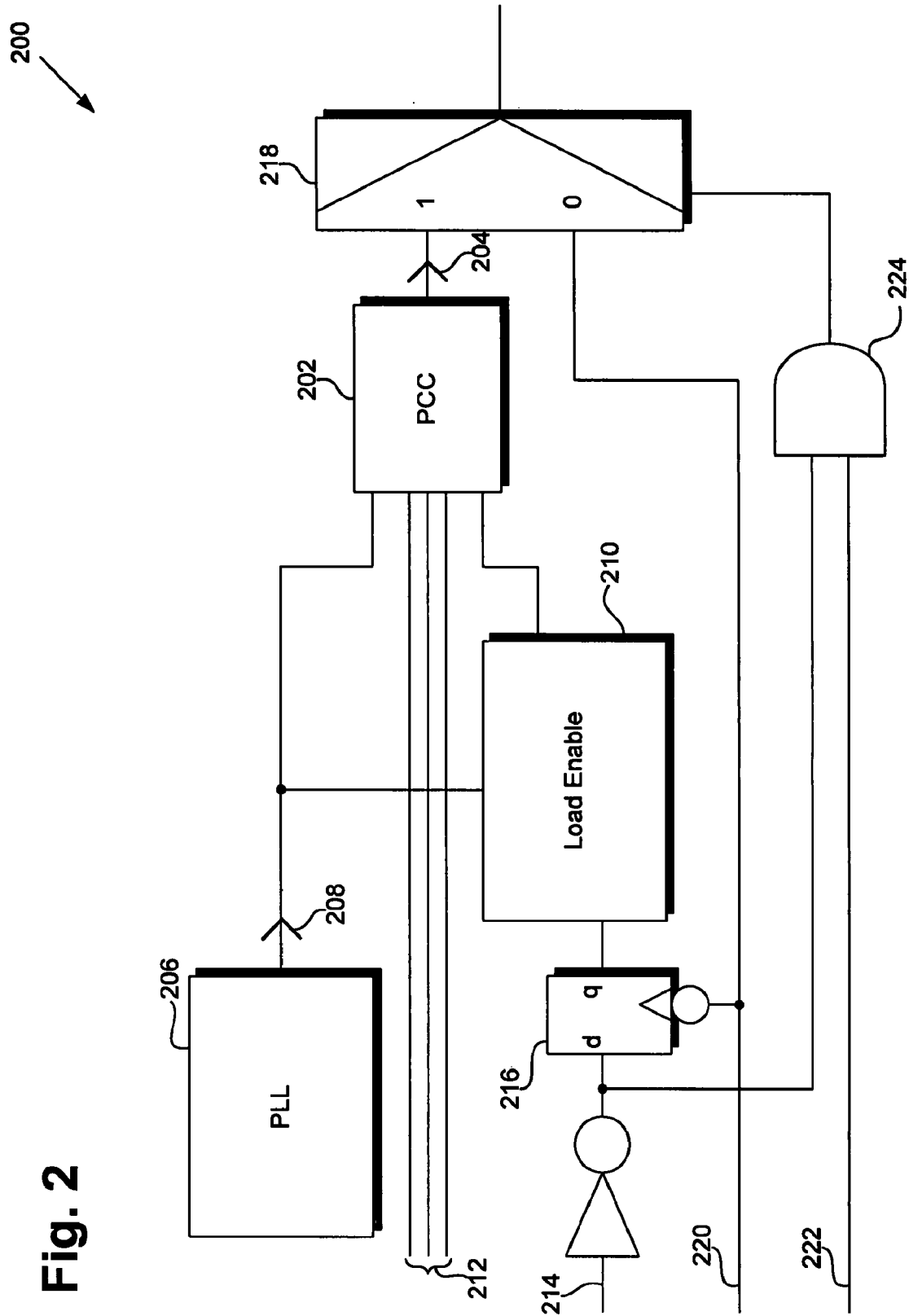
FIG. 2 illustrates a diagram of a circuit including the invention's exemplary programmable clock control architecture.

FIG. 2 illustrates system 200 including the invention's exemplary PCC architecture 202 (corresponding to PCC architecture 102 of FIG. 1), which produces programmed at-speed clock 204 for testing the at-speed operation of an integrated circuit, such as combinational logic 218 (corresponding to combination logic 118 of FIG. 1). System 200 can be integrated on-chip into any system-on-a-chip (SOC), application-specific integrated circuit (ASIC), or any broadband chip, such as a satellite set-top box chip or a broadband communications chip, for example. PCC architecture 202, programmed at-speed clock 204, PLL 206, and PLL clock 208 correspond, respectively, to PCC architecture 102, programmed at-speed clock 104, PLL 106, and PLL clock 108 of FIG. 1, and are illustrated in FIG. 2 along with additional components for explanatory and illustrative purposes. More specifically, system 200 further includes load-enable 210, configuration lines 212, scan-enable 214, flip-flop 216, multiplexer 218, test clock 220, at-speed-enable 222, and logic gate 224.

As shown in FIG. 2, programmed at-speed clock 204 of PCC architecture 202 and test clock 220 are each coupled to an input of multiplexer 218, which is a 2 to 1 multiplexer. Scan-enable 214 and at-speed-enable 222 are logic lines that are input to logic gate 224, whose output is coupled to the select line of multiplexer 218. Additionally, flip-flop 216 can delay scan-enable 214 before being coupled to load-enable 210. The output of PLL 206 (also referred to as a "primary clock source" in the present application), i.e. PLL clock 208, and load-enable 210 are inputs to PCC architecture 202. When PCC architecture 202 is programmed through configuration lines 212, it can output programmed at-speed clock 204 for effectively testing the at-speed operation of an integrated circuit, such as combinational logic 118 of FIG. 1.

Figure 3:
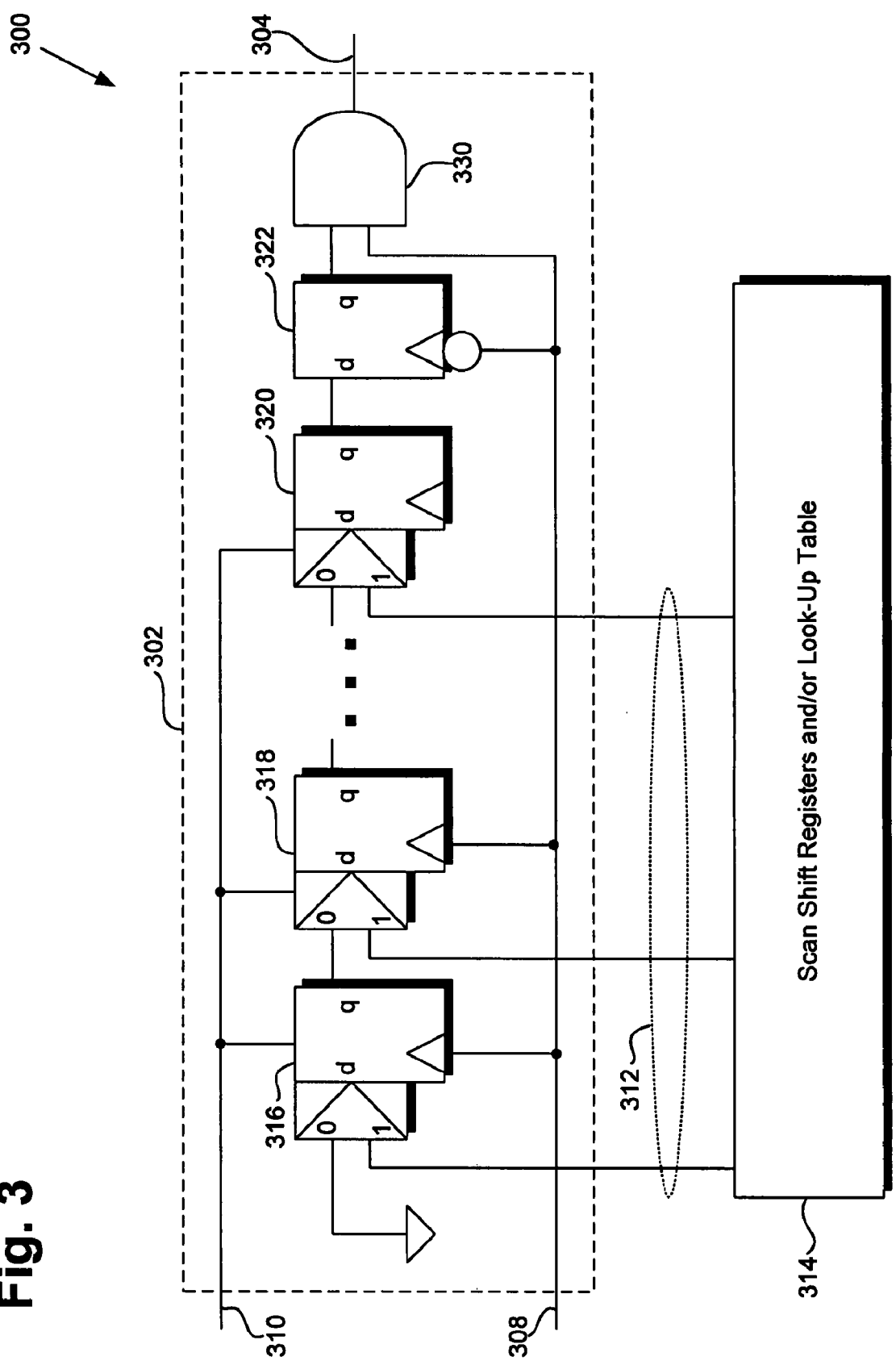
FIG. 3 illustrates a diagram of the invention's exemplary programmable clock control architecture.

FIG. 3 illustrates system 300 including the invention's exemplary PCC architecture 302, which produces programmed at-speed clock 304 for testing the at-speed operation of an integrated circuit (such as combinational logic 118 of FIG. 1). System 300 also includes PLL clock 308, load-enable 310, configuration lines 312, and scan shift registers and/or look-up table 314. PCC architecture 302 and configuration lines 312 correspond, respectively, to PCC architecture 202 and configuration lines 212 of FIG. 2. Additionally, PLL clock 308 and load enable 310 correspond, respectively, to outputs from PLL clock 208 and load enable 210 of FIG. 2, for example.

In the present embodiment, PCC architecture 302 contains a chain of N flip-flops, such as flip-flops 316, 318, and 320, coupled to last flip-flop 322, and logic gate 330. Flip-flops 316, 318, and 320 receive PLL clock 308 and load-enable 310 as inputs. Load-enable 310 can be used to activate or deactivate flip-flops 316, 318, and 320, and PLL clock 308 provides at-speed clock pulses to be modified and/or shaped by PCC architecture 302. FIG. 3 illustrates PCC architecture 302 having N equal to 3 for simplicity in explaining the concepts of the present embodiment, but in other embodiments N can be as great as needed, such as 10, 50, or even 100 flip-flops if required, for example. Each of the N flip-flops in PCC architecture 302 is loaded in accordance with the configuration of data from scan shift registers and/or look-up table 314 through configuration lines 312. As shown in FIG. 3, where N equals 3, PCC architecture 302 has a chain of 3 flip-flops coupled to scan shift registers and/or look-up table 314 by a total of 3 configuration lines. In general, when PCC architecture 302 contains a chain of N flip-flops, it is capable of producing programmed at-speed clock 304 with a total of N test clock pulses and/or dead clock cycles. Thus, in the present embodiment, where N is equal to 3, programmed at-speed clock 304 of FIG. 3 can have three test clock pulses and/or dead clock cycles.

Figure 4:
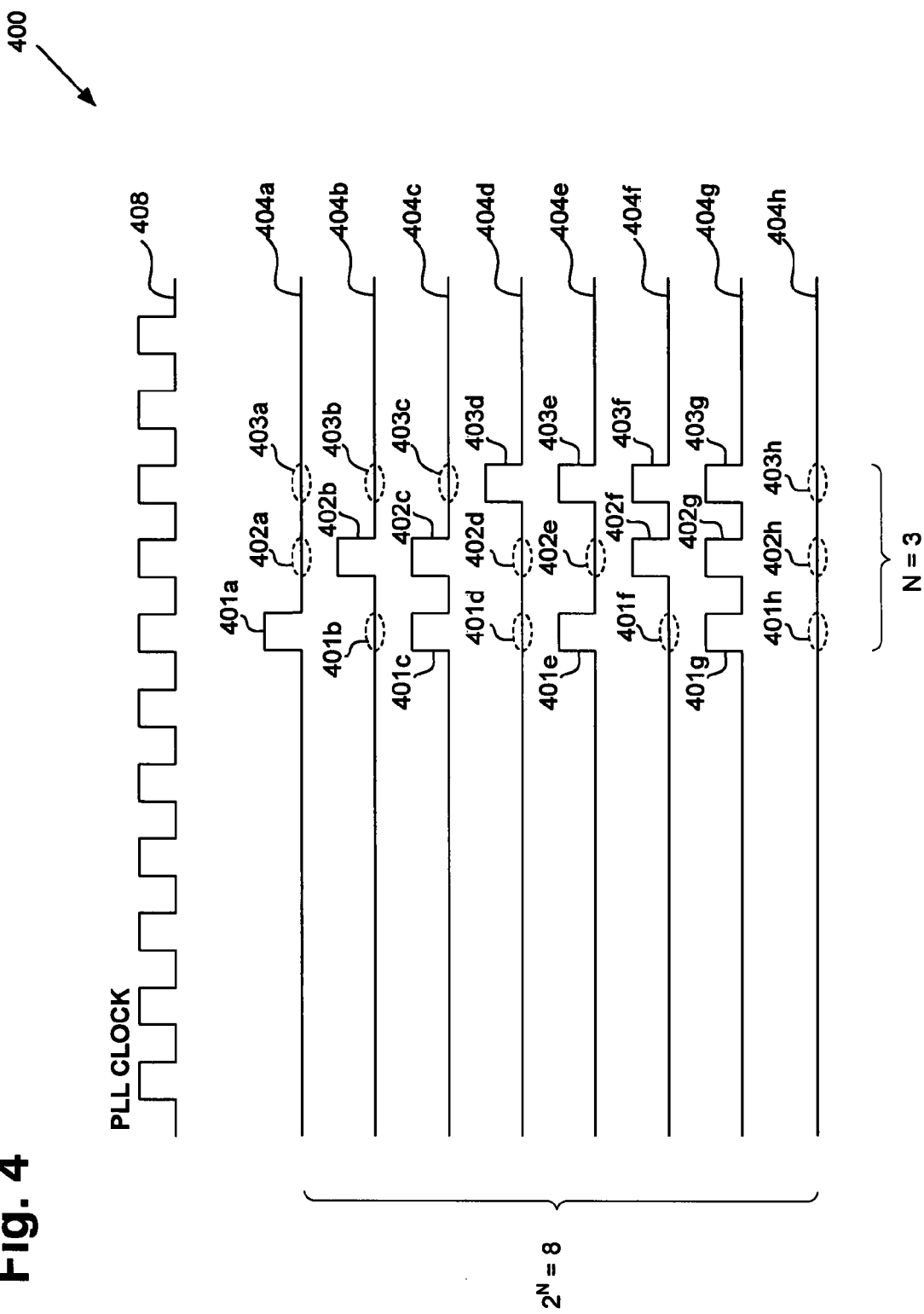
FIG. 4 illustrates one embodiment of the possible outputs produced by the invention's exemplary programmable clock control architecture.

In one embodiment, PCC architecture 302 of FIG. 3 is capable of producing $2^N$ variations of programmed at-speed clock 304, where each variation contains a total of N clock pulses and/or dead clock cycles. FIG. 4 illustrates the possible programmed at-speed clock outputs of PCC architecture 302 when N is equal to 3, for example. As shown in FIG. 4, when N is equal to 3 there is a total of 8 possible patterns of output 304, as represented by test clock pulse patterns 404a through 404h. For example, programmed at-speed clock output 304 can be a clock pulse 401a followed by consecutive dead clock cycles 402a and 403a, as shown by pattern 404a. Programmed at-speed clock output 304 can also be a clock pulse 402b situated between dead clock cycles 401b and 403b, as shown by pattern 404b. Programmed at-speed clock output 304 can be consecutive clock pulses 401c and 402c followed by a dead clock cycle 403c, as shown by pattern 404c, or can be a consecutive dead clock cycles 401d and 402d followed by a clock pulse 403d, as shown by pattern 404d. Additionally, programmed at-speed clock output 304 can be a dead clock cycle 402e situated between clock pulses 401e and 403e, as shown by pattern 404e, or can be a dead clock cycle 401f preceding consecutive clock pulses 402f and 403f, as shown by pattern 404f. Finally, programmed at-speed clock output 304 can be three consecutive clock pulses 401g, 402g, and 403g, or three consecutive dead clock cycles 401h, 402h, and 403h, as shown by patterns 404g and 404h, respectively. As seen in FIG. 4, all clock pulses represented as test clock pulse patterns 404a through 404h are derived from and synchronized with PLL clock 408 (corresponding to PLL clock 308 in FIG. 3).

The desired at-speed test clock pulse patterns 404a through 404h, which can be outputted by at-speed clock output 304 of FIG. 3, can be programmed based on the integrated circuit being tested. Depending on the complexity of the chip under test and the number of test clock pulses required to fully test its at-speed operation, the number of N flip-flops in PCC architecture 302 can be varied and appropriately programmed by scan shift registers and/or look-up table 314 to produce $2^N$ variations of programmed at-speed clock output 304, where each output variation contains a total of N clock pulses and/or dead clock cycles. Thus, PCC architecture 302 provides for a fully programmable on-chip test clock control architecture that can operate at the full operating speed of the chip under test and can be completely customized.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a programmable clock control architecture for at-speed testing has been described.

The invention claimed is:

1. An N-stage programmable clock control architecture, comprising:
    N flip-flops, said N flip-flops being clocked by a primary clock source;
    means for programming said N flip-flops such that said N-stage programmable clock control architecture outputs at least two programmed at-speed clock pulses;
    said means performing a logical operation on a clock signal from said primary clock source and a last flip-flop, said last flip-flop coupled to said N flip-flops.

2. The N-stage programmable clock control architecture of claim 1, wherein said means for programming said N flip-flops comprises scan-shift registers.

3. The N-stage programmable clock control architecture of claim 1, wherein said means for programming said N flip-flops comprises a look-up table.

4. The N-stage programmable clock control architecture of claim 1, wherein said N-stage programmable clock control architecture produces $2^N$ patterns of said programmed at-speed clock pulses.

5. The N-stage programmable clock control architecture of claim 1, wherein said N-stage programmable clock control architecture outputs N at-speed clock pulses.

6. The N-stage programmable clock control architecture of claim 1, wherein said N-stage programmable clock control architecture is implemented on-chip.

7. The N-stage programmable clock control architecture of claim 1, wherein said primary clock source is a PLL.

8. The N-stage programmable clock control architecture of claim 1, wherein said primary clock source has a frequency between approximately 200MHz and approximately 1 GHz.

9. The N-stage programmable clock control architecture of claim 1, wherein said N-stage programmable clock control architecture outputs at least one programmed dead clock cycle.

10. An N-stage programmable clock control architecture, comprising:
    a chain of N flip-flops, said chain of N flip-flops being clocked by a primary clock source;
    means for programming said chain of N flip-flops such that said N-stage programmable clock control architecture outputs N at-speed clock pulses synchronized with said primary clock source;
    said means performing a logical operation on a clock signal from said primary clock source and a last flip-flop, said last flip-flop coupled to said chain of N flip-flops.

11. The N-stage programmable clock control architecture of claim 10, wherein said means for programming said chain of N flip-flops comprises scan-shift registers.

12. The N-stage programmable clock control architecture of claim 10, wherein said means for programming said chain of N flip-flops comprises a look-up table.

13. The N-stage programmable clock control architecture of claim 10, wherein said N-stage programmable clock control architecture produces $2^N$ patterns of said programmed at-speed clock pulses.

14. The N-stage programmable clock control architecture of claim 10, wherein said N-stage programmable clock control architecture outputs at least two at-speed clock pulses.

15. The N-stage programmable clock control architecture of claim 10, wherein said N-stage programmable clock control architecture outputs at least three at-speed clock pulses.

16. The N-stage programmable clock control architecture of claim 10, wherein said N-stage programmable clock control architecture is implemented on-chip.

17. The N-stage programmable clock control architecture of claim 10, wherein said primary clock source has a frequency between approximately 200 MHz and approximately 1 GHz.

18. The N-stage programmable clock control architecture of claim 10, wherein said N-stage programmable clock control architecture outputs at least one programmed dead clock cycle.

19. The N-stage programmable clock control architecture of claim 10, wherein said primary clock source is a PLL.

* * * * *